US011467654B2

(12) United States Patent
Rowley

(10) Patent No.: US 11,467,654 B2
(45) Date of Patent: Oct. 11, 2022

(54) POWER MANAGEMENT INTEGRATED CIRCUIT BASED SYSTEM MANAGEMENT BUS ISOLATION

(71) Applicant: Micron Technology, Inc., Boise, ID (US)

(72) Inventor: Matthew D. Rowley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/327,282

(22) Filed: May 21, 2021

(65) Prior Publication Data

US 2021/0278893 A1    Sep. 9, 2021

Related U.S. Application Data

(63) Continuation of application No. 16/524,852, filed on Jul. 29, 2019, now Pat. No. 11,073,897.

(51) Int. Cl.
*G06F 1/3296* (2019.01)
*G06F 13/20* (2006.01)
(Continued)

(52) U.S. Cl.
CPC .......... *G06F 1/3296* (2013.01); *G06F 1/3206* (2013.01); *G06F 1/3221* (2013.01);
(Continued)

(58) Field of Classification Search
CPC .... G06F 1/3296; G06F 1/3206; G06F 1/3221; G06F 1/3268; G06F 1/3275; G06F 13/20; G06F 13/40; G06F 13/4081
See application file for complete search history.

(56) References Cited

U.S. PATENT DOCUMENTS 6,528,904 B1 * 3/2003 Wong .................. G06F 13/4081
307/119
7,932,708 B2    4/2011 Liu
(Continued)

FOREIGN PATENT DOCUMENTS

KR    20150095267 A    8/2015
WO    2021021484    2/2021

OTHER PUBLICATIONS

"International Application Serial No. PCT/US2020/042793, International Search Report dated Oct. 26, 2020", 3 pgs.
(Continued)

*Primary Examiner* — Glenn A. Auve
(74) *Attorney, Agent, or Firm* — Schwegman Lundberg & Woessner, P.A.

(57) ABSTRACT

A power management integrated circuit (PMIC) is described for providing system management bus (SMB) isolation, along with memory sub-systems which include such a PMIC and methods of operating such devices. In one embodiment, a PMIC comprises a voltage supply input, power management circuitry, and elements of a SMB. The SMB elements can include an SMB input, an SMB hot swap controller coupled to the SMB input, one or more SMBs, and one or more SMB outputs. When integrated with a memory sub-system, one SMB output can be connected to a memory controller and another SMB output to a microcontroller. During different power states (e.g., normal or low power states), certain outputs can be isolated in order to manage communications on the SMB during the different power states of the memory sub-system using the PMIC.

20 Claims, 5 Drawing Sheets

(51) Int. Cl.
    *G06F 13/40*     (2006.01)
    *G06F 1/3206*     (2019.01)
    *G06F 1/3234*     (2019.01)
    *G06F 1/3221*     (2019.01)

(52) U.S. Cl.
    CPC .......... *G06F 1/3268* (2013.01); *G06F 1/3275* (2013.01); *G06F 13/20* (2013.01); *G06F 13/4081* (2013.01); *G06F 2213/40* (2013.01)

(56) References Cited

U.S. PATENT DOCUMENTS

| | | |
|---|---|---|
| 11,073,897 B2 * | 7/2021 | Rowley ................ G06F 1/3206 |
| 2004/0225801 A1 | 11/2004 | Scordalakes et al. |
| 2005/0033996 A1 | 2/2005 | Fong et al. |
| 2011/0320798 A1 | 12/2011 | Zimmer et al. |
| 2014/0223205 A1 | 8/2014 | Muthukaruppan et al. |
| 2015/0102673 A1 | 4/2015 | Alshinnawi et al. |
| 2015/0227187 A1 | 8/2015 | Jeong et al. |
| 2015/0356034 A1 | 12/2015 | Pamley et al. |
| 2018/0356872 A1 | 12/2018 | Loewen et al. |
| 2019/0041964 A1 | 2/2019 | Gadey et al. |
| 2019/0042506 A1 | 2/2019 | Devey et al. |
| 2019/0215980 A1 | 7/2019 | Rhinehart et al. |
| 2021/0034140 A1 | 2/2021 | Rowley |

OTHER PUBLICATIONS

"International Application Serial No. PCT/US2020/042793, Written Opinion dated Oct. 26, 2020", 6 pgs.
"International Application Serial No. PCT US2020 042793, International Preliminary Report on Patentability dated Oct. 2, 2022", 7 pgs.

\* cited by examiner

POWER MANAGEMENT INTEGRATED CIRCUIT BASED SYSTEM MANAGEMENT BUS ISOLATION

PRIORITY APPLICATION

This application is a continuation of U.S. application Ser. No. 16/524,852, filed Jul. 29, 2019, which is incorporated herein by reference in its entirety.

TECHNICAL FIELD

Embodiments of the disclosure relate generally to memory sub-systems and, more specifically, to a power management integrated circuit (PMIC) with system management bus (SMB) isolation for solid-state drives (SSDs) and memory sub-systems that include such a PMIC.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to managing a memory sub-system with a PMIC with SMB isolation. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

In data center and enterprise class storage device (e.g., solid state drives (SSDs)), a host system can access an SSD through a system management bus (SMB) connection to monitor and retrieve vital product data (VPD), which represents a health of the SSD. The mechanism for accessing VPD can depend on a power state of the SSD in some systems. In some SSDs, during normal operation, the VPD is accessed from a memory controller via the SMB, but the memory controller is powered down during a lower power state. In such a system, a separate microcontroller can be used to respond to a host request for VPD data when the drive is in a low power state with the memory controller powered down. In previous systems, the SMB comes into a memory sub-system and is directed to both the microcontroller and the memory controller in parallel, with the path to the memory controller put through a separate SMB isolation device such that when in low power mode, this isolation device disconnects the SMB from the memory controller. In such a system, only the microcontroller is able to service a request for VPD data from a host during low power mode.

Embodiments described herein integrate power management circuitry in a PMIC with SMB routing. In one embodiment, a PMIC interfaces to a host bus and the PMIC buffers the SMB signals to two SMB bus outputs. One output is to the microcontroller and the other is to the memory controller. Because the SMB buffering circuitry is in a PMIC with power management circuitry that controls the power state of the memory sub-system, including the memory controller, the power management integrated circuit (PMIC) can automatically determine a power down or low power situation and isolate the memory controller SMB automatically. Similarly, during normal power operation, the microcontroller SMB may be isolated. Such an architecture provides multiple benefits and improvements to a memory device over previous systems by integrating board level components into an integrated circuit with power management circuitry. These benefits and improvements to a memory device include allowing greater flexibility in controlling an SMB interface between a host and an SSD, as well as lower power usage and smaller size for the SMB components.

Figure 1:
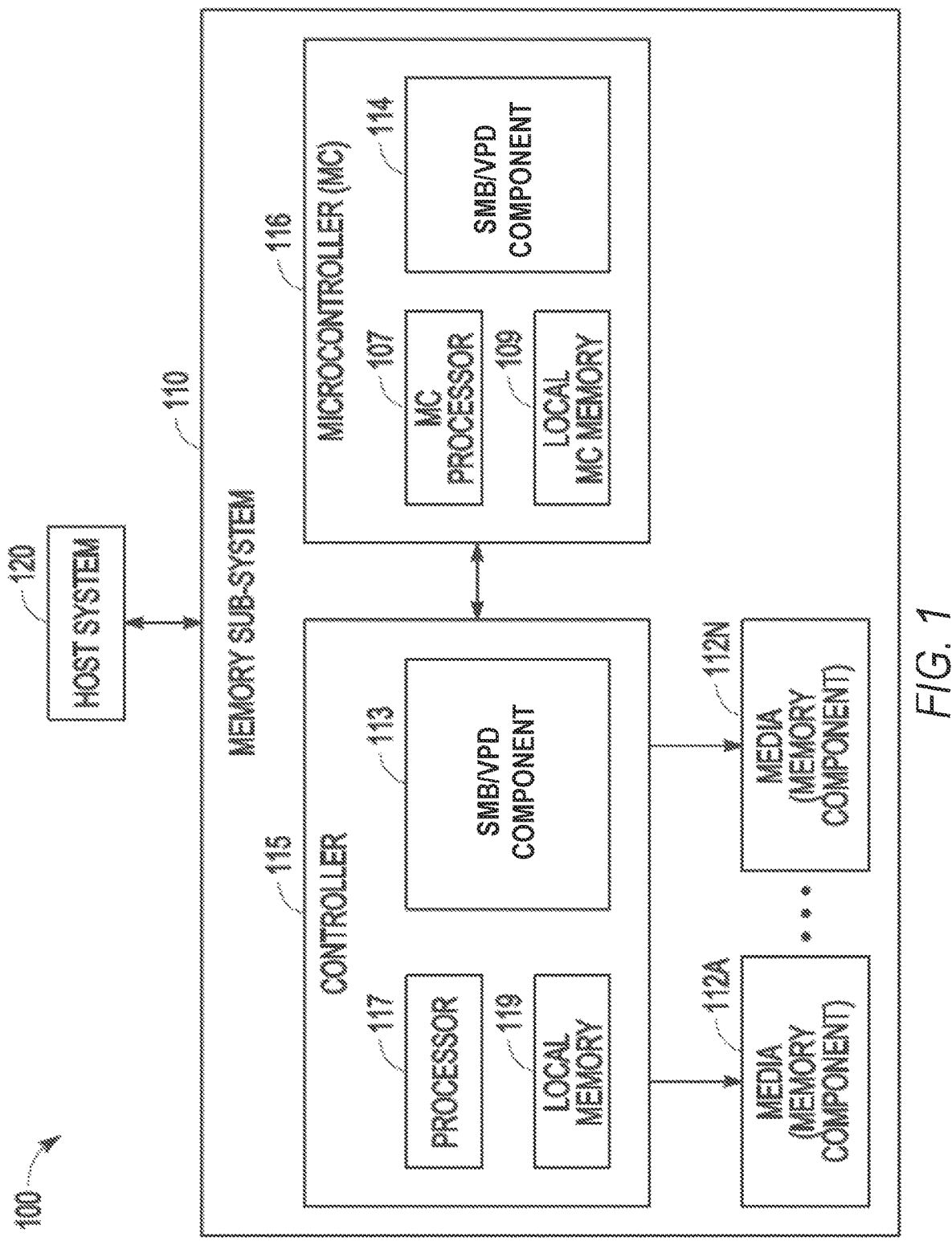
FIG. 1 illustrates an example computing environment that includes a memory sub-system, in accordance with various embodiments.

FIG. 1 illustrates an example computing environment 100 that includes a memory sub-system 110, in accordance with some embodiments of the present disclosure. The memory sub-system 110 can include media, such as memory components 112A to 112N. The memory components 112A to 112N can be volatile memory components, non-volatile memory components, or a combination of such. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), and so forth. The physical host interface can be used to transmit data between the host system 120 and the memory sub-system 110. The host system 120 can further utilize a non-volatile memory (NVM) Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a NAND type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, RAM, ROM, dynamic random access memory (DRAM), synchronous dynamic random access memory (SDRAM), phase change memory (PCM), magneto random access memory (MRAM), NOR flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

A memory sub-system controller 115 (herein referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include ROM for storing micro-code. While the example memory sub-system 110 in FIG. 1 has been illustrated as including the controller 115, in another embodiment of the present disclosure, a memory sub-system 110 may not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes an SMB/VPD component that provides vital product data to host system 120 via communications over an SMB. The VPD may include details of device capabilities and critical operation conditions. Examples of such data can include device class codes that detail device type and programing interface information for the device, a device serial number and model number, link width and link speed capabilities for communication ports, device power requirements, a list of device capabilities or a pointer to a list of device capabilities, or other such information. In some embodiments, additional information such as a temperature value can be stored as VPD data, and other information critical to device operations, such as write count data, critical failure data, or other such information, can be made available via VPD information associated with SMB/VPD component 113. As described above, some or all of this VPD data can be replicated in both the controller 155 and microcontroller (MC) 116 in order to ensure that the VPD is available in response to a host system 120 request regardless of a power state of the memory sub-system 110. In some embodiments, the controller 115 can include a processor 117 (e.g. processing device or processing circuitry) configured to execute instructions stored in local memory 119 for performing the operations described herein to provide VPD to host system 120 using SMB/VPD component 113.

The SMB/VPD component 113 can include firmware executed by the processor 117 to interact with a MC 116, which is another processing device of the memory sub-system 110 to store the setting received from the host system 120. The MC 116 can include a MC processor 107 configured to execute instructions stored in a local MC memory 109. In the illustrated example, the local MC memory 109 of the controller 116 includes an embedded memory configured to store instructions for performing various processes, operations, logic flows, and routines that support operation of the memory sub-system 110 in a boot process of memory sub-system 110. In some embodiments, the local MC memory 109 can include memory registers storing memory pointers, fetched data, and so forth. The local MC memory 109 can also include read-only memory (ROM) for storing micro-code and parameters related to a setting for a device power mode. Firmware can comprise instructions, such as a microcode, which when executed by a controller can cause performance of operations comprising operations associated with a device power mode of a memory sub-system coupled to a host as associated with the embodiments described herein.

A SMB/VPD support component 114 can include firmware having instructions executed by MC processor 107 to generate the signal to the controller 115 to manage VPD data as the memory sub-system 110 transitions between various power states, such as a power-off state, a low-power state, and a normal operating state.

Figure 2:
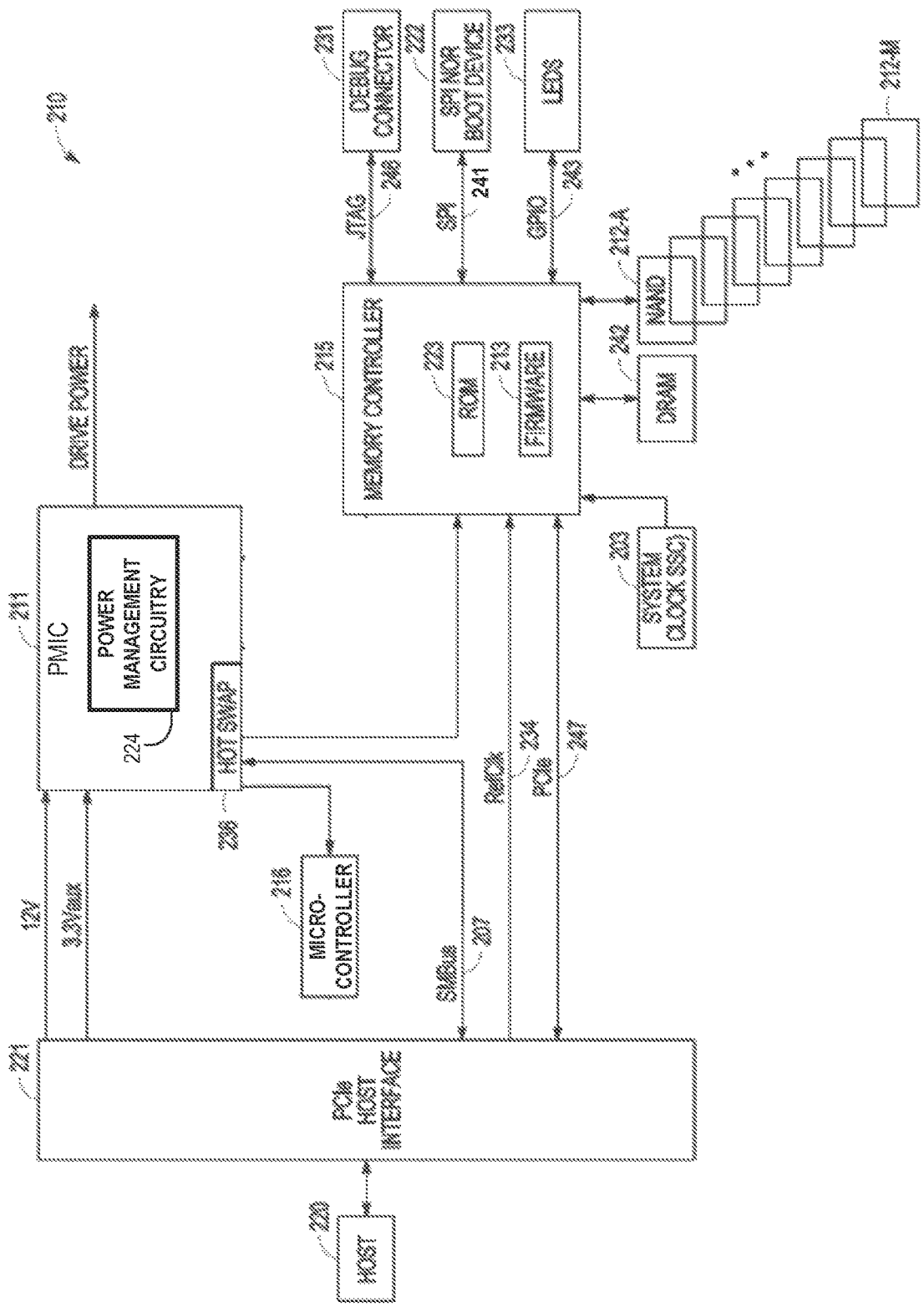
FIG. 2 is a block diagram of an example memory sub-system having a memory controller and a microcontroller arranged to interact with a host, in accordance with various embodiments.

FIG. 2 is a block diagram of an embodiment of an example memory sub-system 210 having a memory controller 215 and a microcontroller 216 arranged to interact with a host 220, with power for memory controller 215 and microcontroller 216 managed by PMIC 211. While certain aspects and connections of PMIC 211 to manage power for memory sub-system 210 are shown, it will be apparent that all such connections are not explicitly illustrated in FIG. 2, and other elements or embodiments of a PMIC are possible. FIG. 2 does particularly show the inclusion of hot swap circuitry 236 in PMIC 211, which manages the connection of SMB 207 from host 220 via SMB 207 to both microcontroller 216 and memory controller 215. As described herein, hot swap circuitry operates to manage connections with various circuitry (e.g. microcontroller 216, memory controller 215, and/or other such circuitry) as the circuits are transitioned to different power states as part of device operations. As circuitry transitions to different power states, the available functionality can change or become unavailable, and so hot swap operations manage such operational swaps during power transitions. In some embodiments, the memory controller 215 corresponds to the controller 115 in FIG. 1, the microcontroller 216 corresponds to the microcontroller 116, the memory sub-system 210 corresponds to the memory sub-system 110 of FIG. 1, and memory components 212-A to 212-M, correspond to memory components 112A-112-N.

As described above, for various embodiments, such as data center and enterprise class SSDs, host access to VPD can be a key function to enable allocation of resources by a host 220. The host 220 can communicate with memory sub-system 210 through the PCIe host interface 221 via a SMB 207 coupling the PCIe host interface 221 to memory controller 215. The SMB 207 can also couple the PCIe host interface 221, and hence the host 220, to VPD components of either memory controller 215 or microcontroller 216. VPD provides data specific to memory sub-system 210 and associated users and consists of multiple fields. The host system 220 can query this data. The hot swap circuitry 236 enables the ability to insert and remove a memory sub-system in a live system and to manage the manner in which power is safely applied and removed. It can also ensure the connection and the disconnection of the host SMB is done in a benign manner.

Additionally, the SMB routed through the PMIC can also carry address resolution protocol (ARP) communications. Placement of the SMB as routed through the PMIC allows the hot swap circuitry of a PMIC to also manage any ARP communications and associated mapping between Internet protocol addresses and link level addresses or other such addresses in various ways depending on the power status of a memory sub-system as controlled by the PMIC.

Power management circuitry 224 of PMIC 211 is used to provide the actual power to different elements of memory sub-system 210. Integration of power management circuitry 224 with hot swap circuitry 236 enables auto-detection of power transition states for buffers within hot swap circuitry 236 to isolate the appropriate circuitry from SMB 207, depending on the particular configuration for the associated power state. For example, in some embodiments, memory controller 215 is powered down in a low power state of memory sub-system 210, and so memory controller 215 is isolated from SMB 207 using buffering circuitry of hot swap circuitry 236. In the embodiment of FIG. 2, host 220 is able to communicate information via PCIe host interface 221 and SMB 207 to PMIC 211. Instead of board level connections via SMB 207 being the sole communication path to microcontroller 216 and memory controller 215, which would cause complications in various power configurations, the embodiment of FIG. 2 uses hot swap circuitry 236 of PMIC 211 to manage VPD communications. As described above, the placement of hot swap circuitry 236 within PMIC 211 provides improved device performance in terms of power usage and device size, among other benefits. In various embodiments, improvements enable auto-isolation detection to disconnect an SMB controller from a host SMB during power transitions and also enable seamless device response to host VPD requests regardless of a power state of a memory sub-system. This can be achieved with a smaller form factor device, improved power design, additional performance operations in power control, and added bus isolation between a host and memory system for VPD and ARP support. Additional details related to auto-detection and buffering of an SMB using a PMIC are described in further detail below, particularly with respect to FIGS. 3 and 4.

In FIG. 2, the memory sub-system 210 can be configured as a memory sub-system with the host 220 configured to communicate with the memory sub-system 210 through an interface 221. Interface 221 can be a PCIe host interface or any other such interface. In the example of FIG. 2, a PCIe line 247 couples the PCIe host interface 221 to the memory controller 215. A reference clock (Ref CLk 234) can also be provided to the memory controller 215 from the PCIe host interface 221. Host 220 also uses SMB 207 via interface 221 as described above.

The memory sub-system 210 can include media, such as the memory components 212-A to 212-M, coupled to the memory controller 215. The memory controller 215 can communicate with the memory components 212-A to 212-M to perform operations such as reading data, writing data, or erasing data at the memory components 212-A to 212-M and other such operations. The memory controller 215 can include hardware such as one or more integrated circuits and/or discrete components, a buffer memory, or a combination thereof. The memory controller 215 can be a microcontroller, special purpose logic circuitry (e.g., a FPGA, an ASIC, etc.), or other suitable processor. The memory controller 215 can include a processor configured to execute instructions stored in a local memory similar to the memory controller 115 of FIG. 1. The memory controller 215 can be coupled to other memory components such DRAM 242.

The memory controller 215 can be coupled to a number of other components to perform functions of the memory sub-system 210. Such other components can include, but are not limited to, a system clock 203, a debug connector 231 having a JTAG connection 246 to the memory controller 215, a serial peripheral interface (SPI) NOR boot device 222 having a SPI connection 241 to the memory controller 215, and light emitting diodes (LEDs) 233 having a general purpose input/output (GPIO) connection 243 to the memory controller 215. The SPI NOR Boot Device 222 is a non-volatile memory that can store a boot loader (BL) for memory sub-system 210. The LEDs 233 can provide an indication of the memory sub-system 210 status through various blink codes. The memory controller 215 can be coupled to a temperature sensor (TS), which provides measurements of the temperature of the memory controller 215, via an I$^2$C bus. An I$^2$C bus is a bus used for communication between one or more masters and a single or multiple slave devices.

In a boot process for the memory sub-system 210, the memory controller 215 can read a BL in a ROM 223. Alternatively, the BL can optionally reside in EEPROM coupled to an I$^2$C bus, which is coupled to the memory controller 215. The memory controller 215 runs the ROM code that contains the BL from ROM 223, or in an alternative configuration from EEPROM. The BL of ROM 223 attempts to load the BL from the SPI NOR Boot Device 222. Once the BL is loaded, control is transferred to the BL, which locates and loads main firmware from a NAND, such as NAND 212-A-212-M. and control is transferred to the main FW.

In addition to including hot swap circuitry 236, the PMIC 211 can be realized as a system and power management microcontroller that is part of the power subsystem and board management unit that can receive power from the PCIe host interface 221, in the form of 12 volts and an auxiliary 3.3 volts, and can provide drive power to the other components of memory sub-system 210. The PMIC 211 can provide power to the memory controller 215 under the control of power management circuitry 224 of PMIC 211 and other voltages can also be supplied by power management circuitry 224. With the PMIC 211 controlling boot and power status signaling to the memory controller 215 for memory sub-system 210, once the memory sub-system 210 comes out of a reset or transitions to other power conditions, a race condition can be avoided. For example, the memory sub-system 210 can be held in reset until power is stable from an event such as power on.

In some embodiments, VPD and SBM settings can be stored within a ferroelectric RAM (FRAM) that is a NVM. A FRAM can read and write like standard SRAM. An I$^2$C command format and address can be used to enable/disable SBM. Reception of the SBM setting from the host 220 and generation of a boot signal to the memory controller 215 based on a value of the SBM setting can be controlled by firmware 213. Once code of the controller firmware 213 has been executed with the execution of code of microcontroller firmware, a power cycle for the memory sub-system 210 can be used for the PMIC 211 to recognize a change in the SBM setting.

In some embodiments, the host 220 can be responsible to provision the microcontroller with the correct (enabled) SBM setting after the memory sub-system 210 has transitioned into a deployed state. To support this provisioning, two commands, which can be vendor specific (VS) commands, can be implemented. The two commands can be a get_SBM_state command and a set_SBM_state command. The get_SBM_state command can be designated as a benign command, and the set_SBM_state command can be designated as a non-benign command.

Storage devices, such as memory sub-system 210, can use VS commands, which can also be referred to a vendor unique (VU) commands, to leverage capabilities of the storage device that extend beyond the standardized commands defined by interface specifications associated with the storage device. This means that storage devices can have more functionalities than the functionalities to meet technology standards for the operation of the storage device. VS commands can be used for debugging and failure analysis, manufacturing, device provisioning, and so forth. VS commands designated as non-benign can also be referred to as restricted commands. Execution of a non-benign VS command by the storage device can change the state of the storage device, change the behavior of the storage device, or cause the storage device to reveal confidential information. Execution of a benign VS command by the storage device does not change the state of the storage device, change the behavior of the storage device, or cause the storage device to reveal confidential information.

The microcontroller firmware has instructions, executable by the PMIC 211, to effectively interact with the host 220 through the memory controller 215, in response to transitioning to a particular power boot state. One or more specific commands can include a command to set the state of the boot mode.

In a boot process for a memory sub-system such as memory sub-system 200, a memory controller such as memory controller 215 can read a set of instructions, which are typically code resident in a ROM. The resident code is small firmware (FW) program referred to as a primary BL, which can run a self-test and search for a boot device, which can typically be a non-volatile memory component, that stores a secondary BL. The BL can read and load programs from a storage media into a main memory and can pass control to the programs for operation of the memory sub-system which can set an initial power mode of the memory sub0system. If the BL in the ROM fails to load the BL, the BL through execution by the memory controller can communicate with a host through an interface, such as a PCIe interface. PCIe is a high-speed bus standard.

JTAG (Joint Test Action Group) is an interface used for debugging and programming devices like controllers, complex programmable logic devices (CPLDs), and FPGAs. A SMB (system management bus) is, in some embodiments, a single-ended simple two-wire bus for the purpose of lightweight communication. The SMB can be arranged as a slave bus relative to other bus structures in the memory sub-system. With both the memory controller's JTAG interface and SMB disabled, external computer assisted reporting (CAR) is disabled. In various power modes, where a memory controller or other processing circuitry of a memory sub-system is unavailable for communication via SMB due to power settings, various different routings of SMB communication may be performed to provide VPD, for example, by a microcontroller such as microcontroller 216 as described herein.

Figure 3:
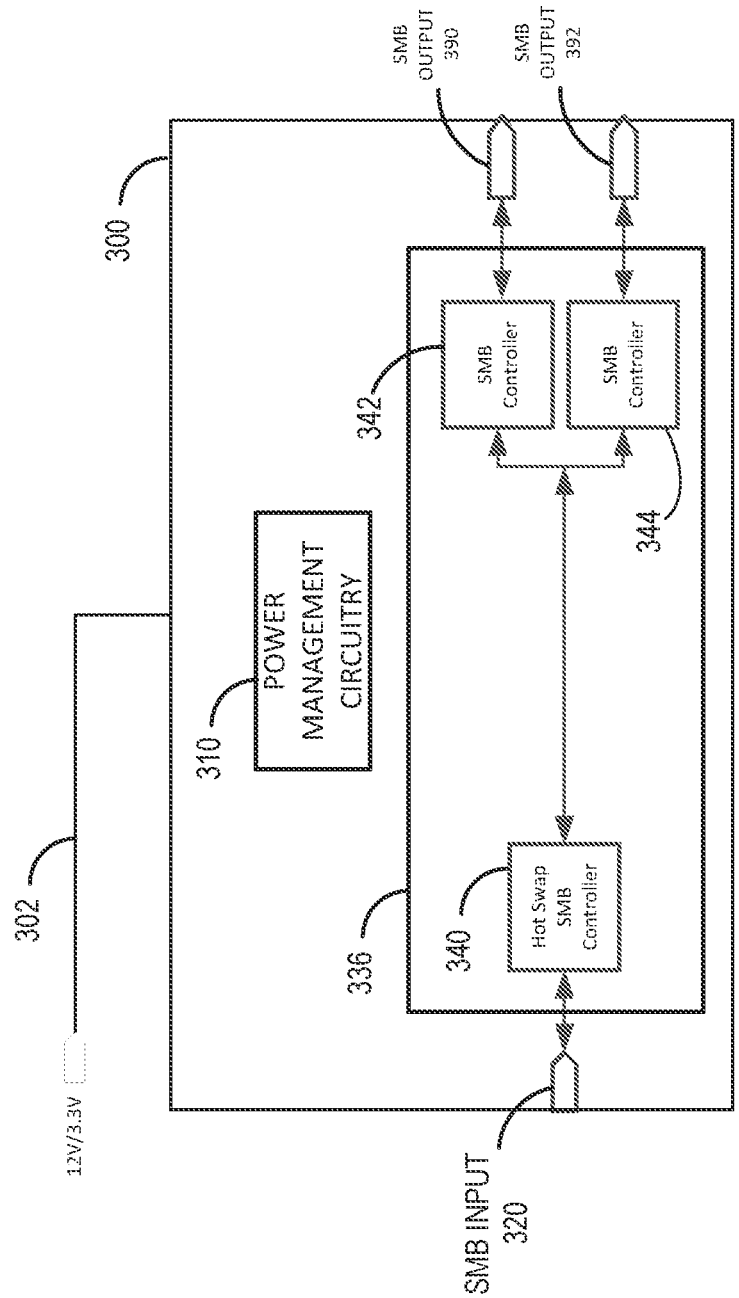
FIG. 3 is an example PMIC, which may be used in a memory subsystem, in accordance with various embodiments.

FIG. 3 is an example PMIC 300 which may be used in a memory subsystem, in accordance with various embodiments. PMIC receives power via power input 302 and distributes this power to other portions of a memory sub-system using power management circuitry 310. In addition to power management circuitry 310, PMIC 300 includes hot swap circuitry 336. Hot swap circuitry 336 includes hot swap SMB controller 340, first SMB controller 342, and second SMB controller 344. SMB input 320 is an input to PMIC 300 that accepts SMB signals (e.g., from host 220 via interface 221 and an SMB line to the PMIC as shown in FIG. 2). Hot swap SMB controller 340 is connected to the SMB input and both the first and second SMB controllers 342 and 344. Each SMB controller is then connected to a corresponding SMB output. In the illustrated embodiment, first SMB controller 342 is connected to SMB output 390, and second SMB controller 344 is connected to SMB output 392. Each SMB output 390, 392 is then connected to a different element of the memory sub-system when the PMIC 300 is integrated as part of a memory sub-system. For example, SMB output 390 can be coupled to a memory controller and SMB output 392 can be connected to a microcontroller separate from the memory controller. During operation while integrated with other elements of a memory sub-system, power management circuitry 310 is used to control power states of elements coupled to the various SMB outputs 390, 392. As the power management circuitry 310 boots and manages power for the controller devices coupled to SMB outputs 390, 392, this control information is used to automatically manage hot swap circuitry 336.

For example, if SMB output 390 is coupled to a memory controller that provides VPD during normal operation but that is powered down during a low power operation, power management circuitry both controls the transition of the memory controller between the low power and normal power modes and provides this information to hot swap SMB controller 340. During low power mode set by power management circuitry 310 when the memory controller coupled to SMB output 390 is powered down, hot swap SMB controller 340 isolates the memory controller using SMB controller 342. During a normal power mode set by power management circuitry 310, when the memory controller coupled to SMB output 390 is functioning and available to provide VPD, hot swap SMB controller 340 uses information from power management circuitry 310 to automatically provide an SMB connection to the memory controller via SMB controller 342.

Similarly, for a microcontroller configured to maintain functionality during low power modes that is coupled to SMB output 392, the hot swap SMB controller 340 can use information on the power mode to automatically isolate the microcontroller from the SMB using SMB controller 344 during a normal operating mode, and connect the microcontroller coupled to SMB output 392 to the SMB during a low power mode. Thus, as the power management circuitry 310 transitions a memory sub-system that includes PMIC 300 to various power modes, hot swap circuitry 336 automatically uses information from power management circuitry 310 to appropriately isolate certain memory sub-system elements from the SMB and to enable SMB connections for other elements, and to adjust these isolation and connection settings automatically as the power management circuitry 310 transitions the memory sub-system elements to different states as part of different power modes.

Power management circuitry 310 can include a number of different elements for both providing power to different elements of a memory sub-system and for managing transitions between power states for such systems. In some embodiments, power management circuitry 310 can include a boot/start controller, a buck regulator, voltage converter, a buck boost regulator, battery health monitoring circuitry, temperature measurement circuitry, $I^2C$ communication circuitry, a sequencer, or various other such circuitry. Some embodiments may include multiple instances of such circuit systems and may further contain additional systems as part of a PMIC, as well as various circuit connections to connect these integrated circuitry (IC) systems with each other and to package connections that can then provide communications and connections with other elements of a memory sub-system.

Figure 4:
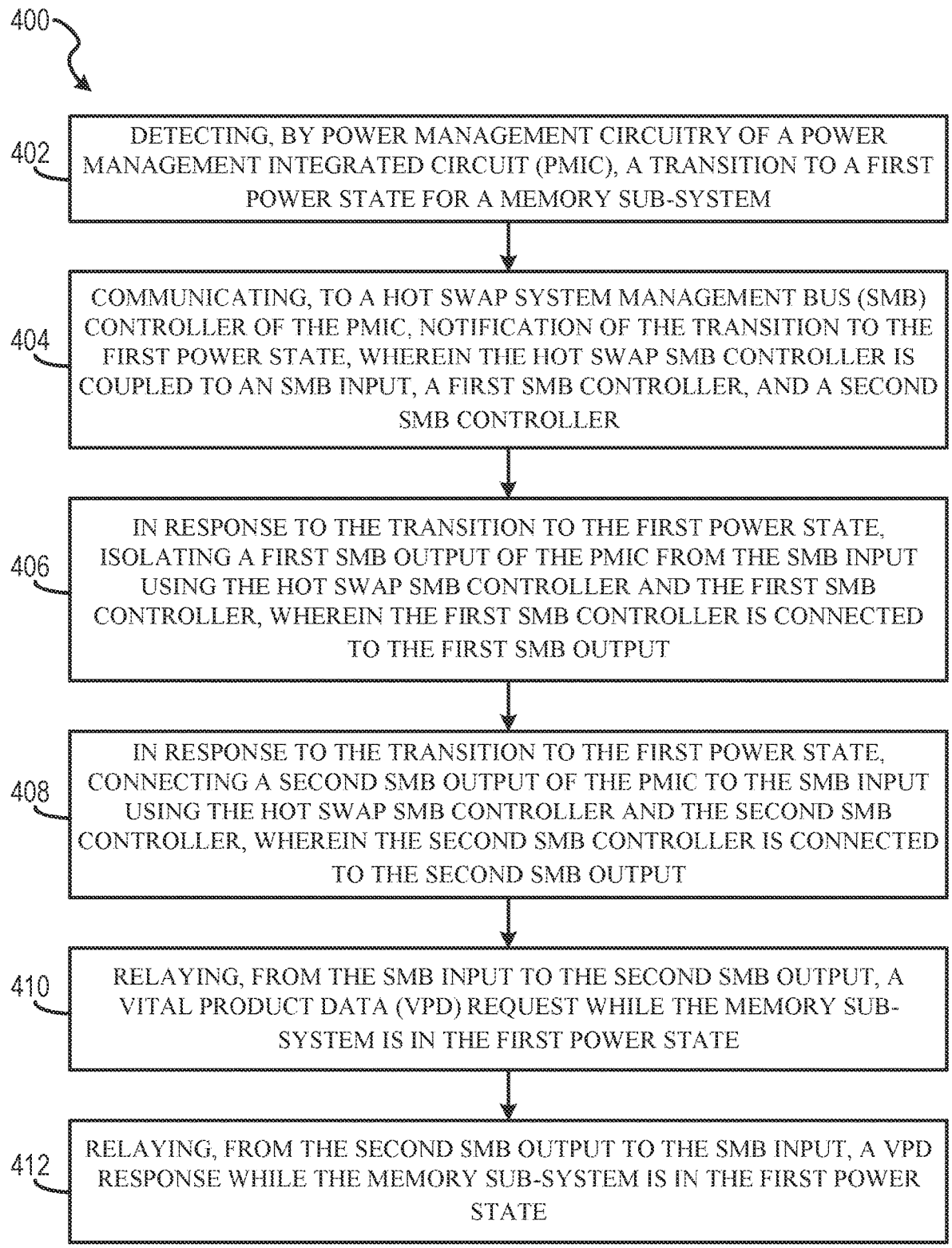
FIG. 4 is a flow diagram of features of an example method of operating a PMIC with automatic SMB isolation, in accordance with various embodiments.

Control and feedback systems as part of power management circuitry 310 of PMIC 300 which monitor all of these above systems can then be used to automatically inform the hot swap circuitry of a current or upcoming power mode. This information is used for automatic isolation of other elements of a memory sub-system as described above FIG. 4 is a flow diagram of features of an example method of operating a PMIC with automatic SMB isolation, in accordance with various embodiments. FIG. 4 particularly illustrates an embodiment of an example method 400 of providing operating PMIC or a memory sub-system having a PMIC with SMB auto-detect isolation.

Method 400 begins with operation 402 detecting, by power management circuitry of a PMIC, a transition to a first power state for a memory sub-system. Such a detection can result from a BL powering up a system or as part of a power mode transition during various operations of a memory device that includes the PMIC. Such power mode transitions can include transitioning from a normal mode to a lower power mode, from a low power mode to a normal power mode, or any other such transition for a memory sub-system that can include any number of different power modes.

A hot swap SMB controller of the PMIC then receives a communication including notification of the transition to the first power state in operation 404. The hot swap SMB controller is coupled to an SMB input, a first SMB controller, and a second SMB controller, as part of the structure of the PMIC to manage isolation of the SMB paths described above in FIGS. 1-3. Then, in operation 406, in response to the transition to the first power state, a first SMB output of the PMIC is isolated from the SMB input using the hot swap SMB controller and the first SMB controller. The first SMB controller used for this isolation is connected to the first SMB output to allow the SMB controller to block communications on this path of the SMB during this power mode. Then, in operation 408, in response to the transition to the first power state, a second SMB output of the PMIC is connected to the SMB input using the hot swap SMB controller and the second SMB controller. This second SMB controller is connected to the second SMB output. These operations above can be considered to set a particular setting of the SMB during a first power mode to isolate certain outputs of the PMIC and connect other outputs during the first power mode. After the SMB is set, in operations 910 and 912, with the first SMB output isolated, the second SMB output can be used to communicate with circuitry connected to the SMB. As described, the second SMB output is used in the first power state to relay a VPD request (e.g. from a host to a microcontroller) in operation 910 and to relay a VPD response in operation 912 (e.g. from a microcontroller to a host).

While the embodiments of FIGS. 1-3 particularly show a system with one microcontroller and one memory controller that would use two SMB outputs of PMIC, various embodiments can use any number of SMB outputs controlled by hot swap circuitry of a PMIC to manage SMB communication routing in a memory subsystem. This can include three or more SMB outputs connected to hot swap SMB controller(s) in a PMIC integrated with a memory system having various power modes. As described above, including SMB management enables flexibility in managing SMB communications such as VPD or ARP communications, while reducing the area and power used in comparison to board level solutions independent of a PMIC. Further, while specific operations are described in the above method for operating such a PMIC or a memory device including such a PMIC, it will be apparent that other such methods are possible within the scope of the described innovations, including methods with repeated or intermediate operations, and similar operations achieving SMB isolation using a PMIC in a memory The following are a non-exhaustive set of example embodiments of methods, devices, and systems, in accordance with the teachings herein.

Example 1 is a power management integrated circuit (PMIC) comprising: a voltage supply input; power management circuitry coupled to the voltage supply input; a system management bus (SMB) input; an SMB hot swap controller coupled to the SMB input and the power management circuitry; one or more SMB controllers coupled to the SMB hot swap controller; and one or more SMB outputs, wherein each of the one or more SMB outputs is coupled to a corresponding SMB controller of the one or more SMB controllers.

In Example 2, the subject matter of Example 1 optionally includes, wherein a first SMB controller of the one or more SMB controllers is configured to isolate the SMB input from a first SMB output of the one or more SMB outputs during a first power state.

In Example 3, the subject matter of Example 2 optionally includes, wherein the power management circuitry is configured to auto-detect a transition to the first power state and to automatically isolate the first SMB output from the SMB input using the first SMB controller in response to the transition to the first power state.

In Example 4, the subject matter of Example 3 optionally includes, wherein a second SMB controller of the one or more SMB controllers is configured to isolate the SMB input from a second SMB output of the one or more SMB outputs during a second power state different from the first power state.

In Example 5, the subject matter of Example 4 optionally includes, wherein the power management circuitry is configured to auto-detect a transition to the second power state and to automatically isolate the second SMB output from the SMB input using the second SMB controller in response to the transition to the second power state.

In Example 6, the subject matter of Example 5 optionally includes, wherein the first SMB controller is configured by the hot swap SMB controller to communicate first SMB signals between the SMB input and the first SMB output during the second power state, and wherein the second SMB controller is configured to communicate second SMB signals between the SMB input and the second SMB output during the first power state.

In Example 7, the subject matter of Example 6 optionally includes, wherein the first power state is a low power state, and wherein the second power state is a normal operating power state.

In Example 8, the subject matter of Example 7 optionally includes, wherein the first SMB output is configured to be coupled to a memory controller of a solid state device (SSD) memory sub-system, and wherein the second SMB output is configured to be coupled to a microcontroller of the SSD memory sub-system.

In Example 9, the subject matter of any one or more of Examples 4-8 optionally include, wherein a third SMB controller of the one or more SMB controllers is configured to isolate the SMB input from a third SMB output of the one or more SMB outputs.

In Example 10, the subject matter of any one or more of Examples 1-9 optionally include wherein the SMB hot swap controller is configured to route vital product data (VPD) between the SMB input and the one or more SMB outputs based on a power mode determined by the power management circuitry.

In Example 11, the subject matter of Example 10 optionally includes wherein the SMB hot swap controller is further configured to route address resolution protocol (ARP) communications between the SMB input and the one or more SMB outputs based on a power mode determined by the power management circuitry.

Example 12 is a memory system comprising: a memory component; a power management integrated circuit (PMIC) comprising: a system management bus (SMB) input; an SMB hot swap controller coupled to the SMB input; a first SMB controller coupled to the SMB hot swap controller; and a first SMB output coupled to the first SMB controller and the memory component; and a memory controller coupled to the memory component and the SMB output of the PMIC.

In Example 13, the subject matter of Example 12 optionally includes, wherein the PMIC further comprises power management circuitry configured to create a low power state of the memory system, and wherein the PMIC is configured to isolate the memory controller using the hot swap SMB controller and the first SMB controller during the low power state.

In Example 14, the subject matter of Example 13 optionally includes further comprising: a host interface coupled to the SMB input of the PMIC; and a microcontroller coupled to a second SMB output of the PMIC; wherein the PMIC further comprises: the second SMB output; and a second SMB controller coupled to the hot swap SMB controller and the second SMB output.

In Example 15, the subject matter of Example 14 optionally includes, wherein the PMIC is configured to enable communications between the microcontroller and a host device via the host interface and the second SMB controller during the low power state.

In Example 16, the subject matter of any one or more of Examples 14-15 optionally include, wherein the power management circuitry is further configured to create a normal power state; wherein the PMIC is configured to isolate the microcontroller using the second SMB controller during the normal power state; and wherein the PMIC is configured to enable SMB communications between the host and the memory controller via the host interface and the first SMB controller during the normal power state.

Example 17 is a method comprising: detecting, by power management circuitry of a power management integrated circuit (PMIC), a transition to a first power state for a memory sub-system; communicating, to a hot swap system management bus (SMB) controller of the PMIC, notification of the transition to the first power state, wherein the hot swap SMB controller is coupled to an SMB input, a first SMB controller, and a second SMB controller; in response to the transition to the first power state, isolating a first SMB output of the PMIC from the SMB input using the hot swap SMB controller and the first SMB controller, wherein the first SMB controller is connected to the first SMB output; and in response to the transition to the first power state, connecting a second SMB output of the PMIC to the SMB input using the hot swap SMB controller and the second SMB controller, wherein the first SMB controller is connected to the first SMB output.

In Example 18, the subject matter of Example 17 optionally includes further comprising: relaying, from the SMB input to the second SMB output, a vital product data (VPD) request while the memory sub-system is in the first power state and while the first SMB output is isolated from the SMB input; and relaying, from the second SMB output to the SMB input in response to the VPD request, a VPD response.

In Example 19, the subject matter of any one or more of Examples 17-18 optionally includes further comprising: detecting, by the power management circuitry of the PMIC, a transition to a second power state different from the first power state for the memory sub-system; communicating, to the hot swap SMB controller of the PMIC, notification of the transition to the second power state; in response to the transition to the second power state, isolating the second SMB output of the PMIC from the SMB input using the hot swap SMB controller and the second SMB controller; and in response to the transition to the second power state, connecting the first SMB output of the PMIC to the SMB input using the hot swap SMB controller and the first SMB controller.

In Example 20, the subject matter of Example 19 optionally includes further comprising: relaying, from the SMB input to the first SMB output, a second VPD request while the memory sub-system is in the second power state; and relaying, from the second SMB output to the SMB input in response to the second VPD request, a second VPD response; wherein the first power state is a low power state, the second power state is a normal power state, the first SMB output is coupled to a memory controller, and the second SMB output is coupled to a microcontroller.

Figure 5:
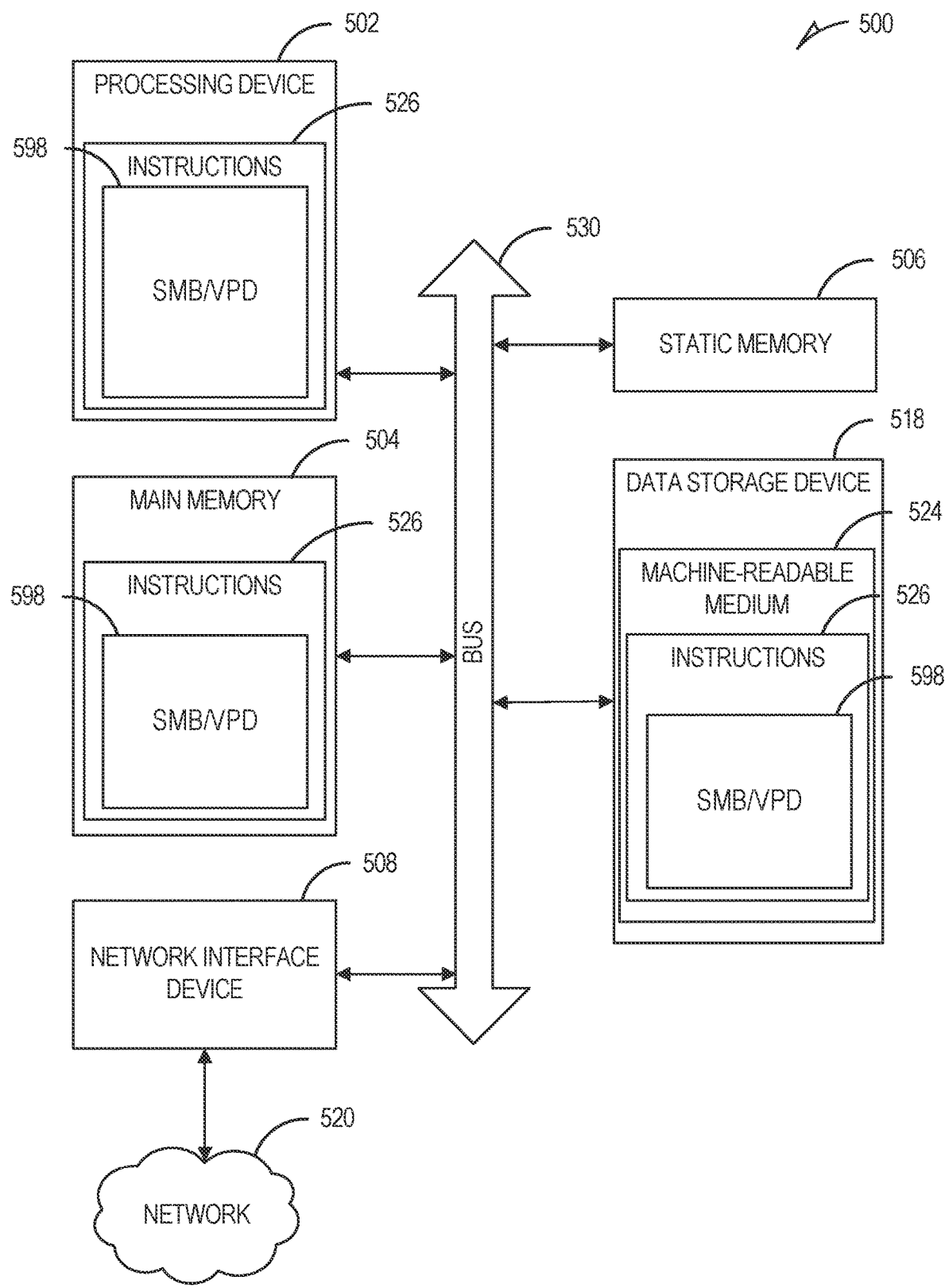
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller. In alternative embodiments, the machine can be connected (e.g., networked) to other machines in a local area network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., ROM, flash memory, DRAM such as SDRAM or registered DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an ASIC, a FPGA, a digital signal processor (DSP), network processor, or the like. The processing device 502 is configured to execute instructions 526 for performing the operations and steps discussed herein. The computer system 500 can further include a network interface device 508 to communicate over a network 520.

The data storage system 518 can include a machine-readable storage medium 524 (also known as a computer-readable medium) on which is stored one or more sets of instructions 526 or software embodying any one or more of the methodologies or functions described herein. The instructions 526 can include a SMB/VPD component 598, which can include instructions similar to instructions in the SMB/VPD component 113, the SMB/VPD support component 114, or in the combination of the SMB/VPD component 113 and the SMB/VPD support component 114 of FIG. 1. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to the SMB/VPD component 513 (e.g., the combination of the SMB/VPD component 113 and the SMB/VPD support component 114 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs. and magnetic-optical disks, ROMs, RAMs. EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a ROMRAM", magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A power management integrated circuit (PMIC) comprising:
   a voltage supply input;
   power management circuitry coupled to the voltage supply input and configured to determine a power mode;
   a system management bus (SMB) input; and
   a hot swap SMB controller coupled to the SMB input and the power management circuitry, the hot swap SMB controller configured to route, based on the power mode, data between the SMB input and an SMB output of multiple SMB outputs.

2. The PMIC of claim 1, wherein the hot swap SMB controller is further configured to route address resolution protocol (ARP) communications between the SMB input and the multiple SMB outputs based on the power mode.

3. The PMIC of claim 1, further comprising:
   a first SMB controller coupled to the hot swap SMB controller and a first SMB output, the first SMB controller being configured to isolate the SMB input from the first SMB output based on the power mode.

4. The PMIC of claim 3, further comprising:
   a second SMB controller coupled to the hot swap SMB controller and a second SMB output, the second SMB controller being configured to isolate the SMB input from the second SMB output during a second power mode different from the power mode.

5. The PMIC of claim 4, wherein the power management circuitry is configured to auto-detect a transition to the second power mode and to automatically isolate the second SMB output from the SMB input using the second SMB controller in response to the transition to the second power mode.

6. The PMIC of claim 5, wherein:
   the first SMB controller is configured by the hot swap SMB controller to communicate first SMB signals between the SMB input and the first SMB output during the second power mode; and
   the second SMB controller is configured to communicate second SMB signals between the SMB input and the second SMB output during the power mode.

7. The PMIC of claim 4, wherein:
   the first SMB output is configured to be coupled to a memory controller of a solid state device (SSD) memory sub-system; and
   the second SMB output is configured to be coupled to a microcontroller of the SSD memory sub-system.

8. The PMIC of claim 4, wherein a third SMB controller is configured to isolate the SMB input from a third SMB output of the multiple SMB outputs.

9. The PMIC of claim 1, wherein the data is vital product data (VPD) that represents a health of a solid-state drive (SSD).

10. A memory system comprising:
    a memory component;

a power management integrated circuit (PMIC) comprising:
   a system management bus (SMB) input; and
   a hot swap SMB controller coupled to the SMB input, the hot swap SMB controller configured to route, based on a power mode, data between the SMB input and an SMB output of multiple SMB outputs.

11. The memory system of claim 10, wherein:
the PMIC further comprises power management circuitry configured to create a first power mode of the memory system; and
the PMIC is configured to isolate a memory controller of the memory component using the hot swap SMB controller and a first SMB controller during the first power mode.

12. The memory system of claim 11, further comprising:
a host interface coupled to the SMB input of the PMIC; and
a microcontroller coupled to a second SMB output of the PMIC;
wherein the PMIC further comprises:
   the second SMB output; and
   a second SMB controller coupled to the hot swap SMB controller and the second SMB output.

13. The memory system of claim 12, wherein the PMIC is configured to enable communications between the microcontroller and a host device via the host interface and the second SMB controller during the power mode.

14. The memory system of claim 12, wherein:
the power management circuitry is further configured to create a second power mode;
the PMIC is configured to isolate the microcontroller using the second SMB controller during the second power mode; and
the PMIC is configured to enable SMB communications between a host device and the memory controller via the host interface and the first SMB controller during the second power mode.

15. The memory system of claim 10, wherein the hot swap SMB controller is further configured to route address resolution protocol (ARP) communications between the SMB input and the multiple SMB outputs based on the power mode.

16. A method comprising:
detecting, by power management circuitry of a power management integrated circuit (PMIC), a transition to a first power mode for a memory sub-system;
communicating, to a hot swap system management bus (SMB) controller of the PMIC, notification of the transition to the first power mode;
in response to the transition to the first power mode, connecting a first SMB output of the PMIC to an SMB input using the hot swap SMB controller and a first SMB controller connected to the first SMB output; and
routing, by the hot swap SMB controller, based on the memory sub-system being in the first power mode, data between the SMB input and the first SMB output.

17. The method of claim 16, wherein the routing of the data between the SMB input and the first SMB output comprises:
relaying, from the SMB input to the first SMB output, a vital product data (VPD) request; and
relaying, from the first SMB output to the SMB input in response to the VPD request, a VPD response.

18. The method of claim 16, further comprising:
detecting, by the power management circuitry of the PMIC, a transition to a second power mode different from the first power mode for the memory sub-system;
communicating, to the hot swap SMB controller of the PMIC, notification of the transition to the second power mode; and
in response to the transition to the second power mode:
   isolating the first SMB output of the PMIC from the SMB input using the hot swap SMB controller and the first SMB controller; and
   connecting a second SMB output of the PMIC to the SMB input using the hot swap SMB controller and a second SMB controller.

19. The method of claim 18, further comprising:
relaying, from the SMB input to the second SMB output, a second VPD request while the memory sub-system is in the second power mode; and
relaying, from the second SMB output to the SMB input in response to the second VPD request, a second VPD response.

20. The method of claim 18, further comprising:
configuring, by the hot swap SMB controller, the first SMB controller to communicate first SMB signals between the SMB input and the first SMB output during the first power mode; and
configuring the second SMB controller to communicate second SMB signals between the SMB input and the second SMB output during the second power mode.

* * * * *